United States Patent
Mizutani et al.

(10) Patent No.: US 7,697,382 B2
(45) Date of Patent: Apr. 13, 2010

(54) NEAR-FIELD LIGHT GENERATING METHOD AND NEAR-FIELD OPTICAL HEAD USING A LIGHT BLOCKING METAL FILM HAVING A FINE OPENING WHOSE SIZE IS NOT MORE THAN A WAVELENGTH OF IRRADIATED LIGHT, AND NEAR-FIELD OPTICAL MICROSCOPE HAVING THE OPTICAL HEAD

(75) Inventors: Natsuhiko Mizutani, Tokyo (JP); Tomohiro Yamada, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1057 days.

(21) Appl. No.: 10/529,892

(22) PCT Filed: Sep. 24, 2004

(86) PCT No.: PCT/JP2004/014445

§ 371 (c)(1),
(2), (4) Date: Nov. 22, 2005

(87) PCT Pub. No.: WO2005/031468

PCT Pub. Date: Apr. 7, 2005

(65) Prior Publication Data

US 2006/0124834 A1    Jun. 15, 2006

(30) Foreign Application Priority Data

Sep. 26, 2003   (JP)  .............................. 2003-334610

(51) Int. Cl.
*G11B 7/18* (2006.01)
*G02B 21/06* (2006.01)
*G01N 13/14* (2006.01)
*G12B 21/06* (2006.01)

(52) U.S. Cl. ................... 369/44.23; 369/300; 359/385; 850/30; 250/216

(58) Field of Classification Search .................. 250/216; 369/44.23
See application file for complete search history.

(56) References Cited

U.S. PATENT DOCUMENTS 4,659,429 A    4/1987   Isaacson et al. ............. 156/644

(Continued)

FOREIGN PATENT DOCUMENTS

| JP | 8-179493 | 7/1996 |
| JP | 11-72607 | 3/1999 |
| JP | 11-265520 | 9/1999 |
| WO | WO 02/10830 A2 | 2/2002 |

OTHER PUBLICATIONS

International Search Report mailed Mar. 23, 2005, issued in International Application No. PCT/JP2004/014445.

(Continued)

*Primary Examiner*—Mark F Huff
*Assistant Examiner*—John Ruggles
(74) *Attorney, Agent, or Firm*—Fitzpatrick, Cella, Harper & Scinto

(57) ABSTRACT

A near-field light generating method for irradiating light from a light source to a metal film having a fine opening that has a size of not more than a wavelength of the light emitted from the light source, and forming a fine light spot adjacent to the fine opening on a light outgoing side of the fine opening. The method includes providing the metal film with a rectangular fine opening whose length to width ratio is between 1.1 times and 2 times that of a standard square opening, obtained by increasing the length of the standard square opening, and irradiating the metal film with light from the light source to form the fine light spot, which has a length and a width that are substantially equal to those of the standard square opening, and where the fine light spot has a light intensity, which is not less than two times that of the standard square opening. This method is applicable in a corresponding near-field optical head, which can be included either in an optical microscope to observe a sample surface or in an apparatus for recording and reproducing with respect to a recording medium.

5 Claims, 6 Drawing Sheets

U.S. PATENT DOCUMENTS

| | | | |
|---|---|---|---|
| 5,973,316 A | 10/1999 | Ebbesen et al. | 250/216 |
| 6,052,238 A | 4/2000 | Ebbesen et al. | 359/738 |
| 6,171,730 B1 | 1/2001 | Kuroda et al. | 430/5 |
| 6,304,527 B1 | 10/2001 | Ito et al. | 369/44.23 |
| 6,359,852 B1 * | 3/2002 | Ueyanagi | 369/118 |
| 7,050,144 B2 | 5/2006 | Mizutani et al. | 355/19 |
| 2002/0031299 A1 | 3/2002 | Hatakoshi | 385/31 |
| 2002/0154859 A1 * | 10/2002 | Kuroda et al. | 359/558 |
| 2004/0121245 A1 | 6/2004 | Inao et al. | 430/5 |
| 2005/0057752 A1 | 3/2005 | Inao et al. | 356/400 |
| 2005/0063445 A1 | 3/2005 | Mizutani et al. | 372/94 |
| 2005/0064303 A1 | 3/2005 | Yamada et al. | 430/5 |
| 2006/0003236 A1 | 1/2006 | Mizutani et al. | 430/5 |
| 2006/0003269 A1 | 1/2006 | Ito et al. | 430/323 |

OTHER PUBLICATIONS

Written Opinion mailed Mar. 23, 2005, issued in International Application No. PCT/JP2004/014445.

Chen, Fang, et al., "A Study of Near-field Aperture Geometry Effects on Very Small Aperture Lasers (VSAL)," Proceedings of the SPIE—The International Society For Optical Engineering, vol. 5069, No. 1, Sep. 16, 2003, pp. 312-318.

* cited by examiner

NEAR-FIELD LIGHT GENERATING METHOD AND NEAR-FIELD OPTICAL HEAD USING A LIGHT BLOCKING METAL FILM HAVING A FINE OPENING WHOSE SIZE IS NOT MORE THAN A WAVELENGTH OF IRRADIATED LIGHT, AND NEAR-FIELD OPTICAL MICROSCOPE HAVING THE OPTICAL HEAD

This application is a U.S. national stage application of PCT International Application No. PCT/JP2004/014445, filed Sep. 24, 2004, and which claims priority from Japanese patent application number 2003-334610, filed Sep. 26, 2003, both of which are incorporated by reference herein in their entirety.

TECHNICAL FIELD

The present invention relates to a near-field light generating method, a near-field exposure mask, a near-field exposure method, a near-field exposure apparatus, a near-field optical head, a near-field optical microscope, and a recording and reproducing apparatus.

PRIOR ART

The increasing capacity of a semiconductor memory and the increasing speed and density of a CPU processor have inevitably necessitated further improvements in the fineness of microprocessing through optical lithography. Generally, the limit of microprocessing with an optical lithographic apparatus is on an order of the wavelength light being used. Thus, the wavelength of light used in optical lithographic apparatuses has been shortened more and more. Currently, a near ultraviolet laser is used, and microprocessing on an order of 0.1 µm is enabled. While the fineness is being improved in the optical lithography, in order to assure microprocessing on an order of 0.1 µm or narrower, there still remain many unsolved problems, such as further shortening of the wavelength of laser light, development of lenses usable in such a wavelength region, and the like.

On the other hand, as a means for enabling microprocessing on an order of 0.1 µm or narrower, a microprocessing apparatus using a principle of a near-field optical microscope (scanning near-field optical microscope: SNOM), has been proposed. For example, an exposure method has been proposed in which, by use of near-field light leaking from a fine slit of a size not greater than 100 nm, local exposure that exceeds the light wavelength limit is performed to a resist.

As a means for such a purpose, a method of performing microprocessings is utilized, in which a near-field probe is provided and a near field is generated by localized plasmon generated in a metal pattern, to effect microprocessing. In this method, however, microprocessing is performed with one or more processing probes, as in unicursal drawing, so that the throughput is not necessarily improved satisfactorily.

As another method, Japanese Laid-Open patent Application (JP-A) No. Hei 08-179493 has proposed a method such that a photomask with a fine opening pattern, having a size of not more than a wavelength of light, is provided with a prism, the light is caused to enter the photomask at an angle causing total reflection, and a pattern of the photomask is simultaneously transferred to a resist by use of evanescent light leaking from the total reflection surface.

Further, U.S. Pat. No. 6,171,730 discloses such an exposure technique that a photomask, including a light blocking film having an opening pattern of not more than 0.1 µm, is irradiated with light from its back side and by use of near-field light leaking from the opening pattern, so that the pattern of the photomask is simultaneously transferred to a resist.

However, with respect to the above-described methods in which the near-field light is generated by use of the photomask having a fine opening pattern, a further improvement in generation efficiency of near-field light and generation of higher intensity near-field light are desired.

DISCLOSURE OF THE INVENTION

An object of the present invention is to provide a near-field light generating method and a near-field exposure mask, which permit a higher-efficiency generation of more intense near-field light.

Another object of the present invention is to provide a near-field exposure method and apparatus and a near-field light optical head, which utilizes the above method or the mask.

A further object of the present invention is to provide a near-field optical microscope and a recording and reproducing apparatus, which use the near-field optical head.

According to the present invention, a near-field light generating method is provided for forming a fine light spot at a portion adjacent to a fine opening having a size of not more than a wavelength of light on a light outgoing side of the fine opening by irradiating the fine opening with the light, the method comprising:

forming a light spot having a length and a width which are substantially equal to each other by the fine opening, the fine opening having a rectangular shape having a length and a width which are different from each other.

In the above-near-field light generating method, the length and the width of the light spot may be determined by the width of the rectangular opening.

In the near-field generating method, the fine opening may be provided in a plurality of fine openings including the rectangular opening and a slit-like opening.

According to the present invention, a near-field exposure mask comprises a mask base material, a light blocking layer disposed on the mask base material, and a fine opening having a size of not more than a wavelength of light used for exposure, wherein the fine opening comprises a rectangular opening having a length and a width which are different from each other, the rectangular opening having a length/width ratio which permits transfer of a pattern having a length and a width which are substantially equal to each other.

In the near-field exposure mask, the fine opening is provided in a plurality of fine openings including the rectangular opening and a slit-like opening. Further, the fine opening has a length/width ratio of 1.1 to 2.

According to the present invention, a near-field exposure method comprises providing the near-field exposure mask described above, and exposing an exposure object to light by using the near-field exposure mask.

According to the present invention, a near-field exposure apparatus, for exposing an exposure object to light, comprises the near-field exposure mask described above, and a light source to be exposed to light.

According to the present invention, a near-field optical head comprises:

means for generating near-field light, provided with a rectangular fine opening having a size of not more than a wavelength of light or a combination of the rectangular fine opening and a slit-like opening, wherein a light spot, having a length and a width, which are substantially equal to each other by the rectangular fine opening, is formed at a portion adjacent to an opening portion on a light outgoing side of the rectangular fine opening.

According to the present invention, a near-field optical microscope, for effecting surface observation of a sample, comprises a near-field optical head as described above.

According to the present invention, a recording and reproducing apparatus, for effecting recording and reproduction with respect to a recording medium, comprises the near-field optical head described above.

These and other objects, features and advantages of the present invention will become more apparent upon a consideration of the following description of the preferred embodiments of the present invention, taken in conjunction with the accompanying drawings.

BRIEF DESCRIPTION OF THE DRAWINGS

FIGS. 2A and 2B are schematic views showing analysis results of near-field light by the near-field exposure photomask, wherein FIG. 2A shows a near-field distribution in the neighborhood of a rectangular opening in the Embodiment of the present invention and FIG. 2B shows a near-field distribution in the neighborhood of a square opening as a comparative Embodiment.

BEST MODE FOR CARRYING OUT THE INVENTION

The present invention is characterized in that in a near-field light generating method, a higher intensity near-field light is obtained by using a rectangular opening having a length (long side) and a width (short side), which are different from each other (herein, simply referred to as a "rectangular opening").

The present invention will now be described with reference to the drawings.

Figure 1:
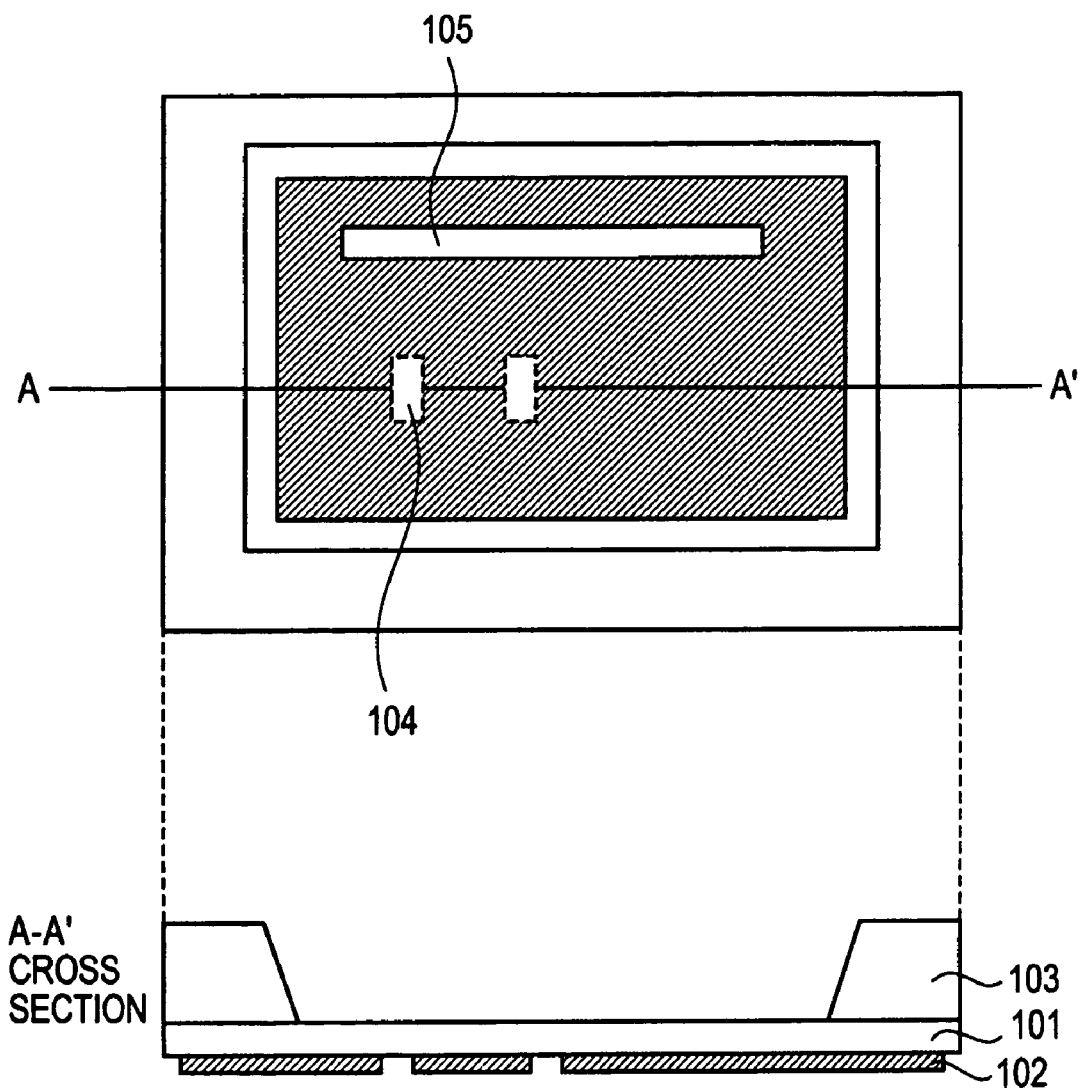
FIG. 1 is a schematic view showing a structure of a near-field exposure photomask according to an Embodiment of the present invention.

FIG. 1 shows a structure of a near-field exposure mask (photomask) according to an embodiment of the present invention.

In FIG. 1, the near-field exposure mask includes a mask base material 101, which is transparent to a wavelength of a light source, a metal film 102 having a thickness t disposed thereon, a substrate 103 for supporting the mask base material 101, a rectangular fine opening pattern 104, disposed in the metal film 102, having a size of not more than the wavelength, and a slit-like fine opening having a width of not more than the wavelength. The mask base material comprises a 0.1-100 μm thick film and is supported on the substrate 103.

The photomask is, as described later, caused to closely contact a thin film resist applied onto a substrate, and is irradiated with light from the mask base material side to be used for pattern exposure.

A description of near-field light by the rectangular fine opening, provided in the photomask described above, will now be explained, on the basis of an analysis result according to a finite difference time domain method.

In the analysis, a calculation is performed on the precondition that a mask, comprising an SiN layer and a 50 nm-thick Cr film disposed thereon, is placed in such a state that it closely contacts a sufficiently thick photoresist. A wavelength of light from a light source is 436 nm (g line as an emission line of Hg) in a vacuum. The calculation results are shown with respect to two polarization directions perpendicular to each other and are obtained, respectively, by adding an independently calculated result of light intensity. The mask used comprises a light blocking film of Cr provided with a fine opening.

Figure 2A:
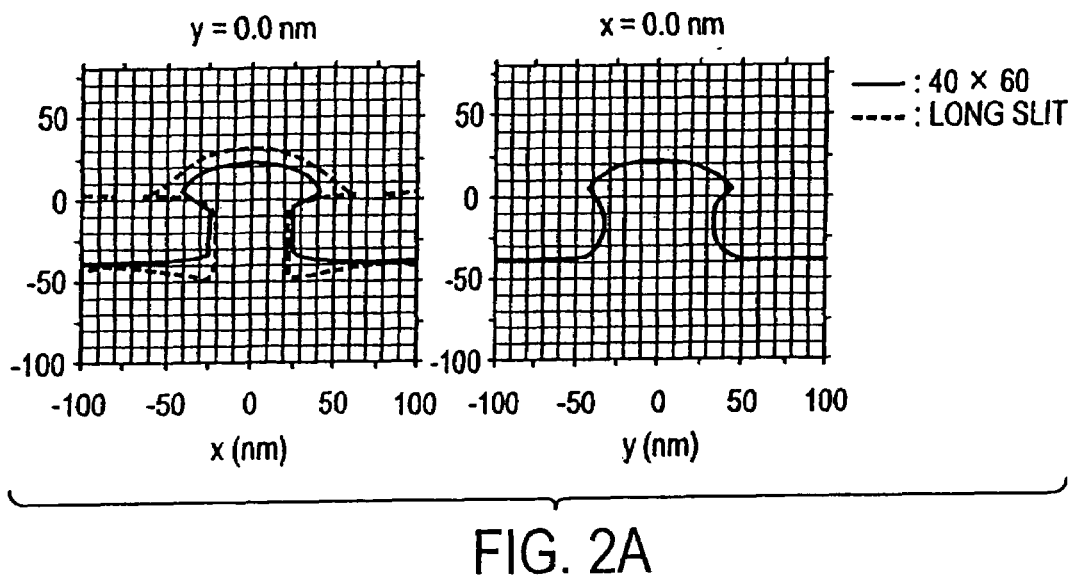

FIG. 2A shows a near-field distribution in the neighborhood of the rectangular opening having a size of 40 nm (width)×60 nm (length).

In FIG. 2A, a solid line represents an iso-intensity line of an intensity of 0.3 in the case when an intensity of incident light is taken as 1. As shown in FIG. 2A, at a depth of 20 nm in the resist, it is found that the near-field distribution has an exposure of 50 nm in the x direction and 40 nm in the y direction. Further, a dashed line represents an iso-intensity line of an intensity of 0.3 in a near-field distribution at a cross section of a 40 nm-wide slit-like opening (long slit), which is disposed together with the fine opening.

Figure 2B:
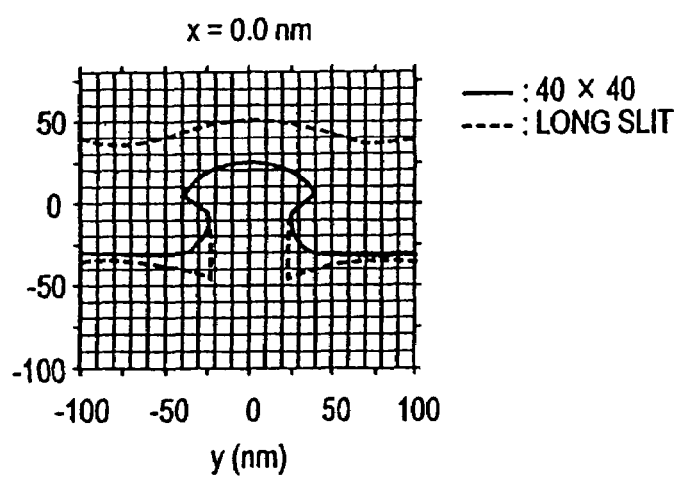

FIG. 2B shows, as a comparative embodiment, a near-field distribution in the neighborhood of a square opening having a size of 40 nm×40 nm.

The near-field in the neighborhood of the square opening has an intensity lower than that in the neighborhood of the rectangular opening. Accordingly, in this embodiment, a solid line represents an iso-intensity line having an intensity of 0.15 in the case of an incident light intensity of 1. The iso-intensity line shows that the intensity of the incident light is to such an extent that the incident light reaches a depth of 25 nm. It is found that the resultant spot has a size of 50 nm×50 nm at a depth of 20 nm. Further, a dashed line represents an iso-intensity line having an intensity of 0.15 in a near-field distribution at a cross section of a 40 nm-wide slit-like opening (long slit) disposed together with the fine opening, and shows a profile which extends in a direction along the mask surface.

From the above results of calculation, the following points have been found.

One is that a distribution intensity of near-field light in the neighborhood of the rectangular fine opening is higher than that of the square fine opening.

In the case when an exposure condition is selected on the basis of formation of a latent image, having a desired size, which reaches a depth of 20 nm of the resist and the rectangular opening is used with respect to the resist, it is found that an exposure time may be determined, so that the iso-intensity line having an intensity of 0.3 provides a limit of solubility/insolubility of the resist. Further, by effecting the exposure for such an exposure time, an 80 nm-wise line pattern can be formed in a depth of 20 nm, even when the slit-like fine opening is used. In order to provide a line pattern having a width substantially equal to that of a spot, the width of the slit-like fine opening may be further narrowed. More specifically, when a slit-like opening is formed with a width of 30 nm, a line pattern with a width of 50 nm can be formed in a depth of 20 nm in the resist.

On the other hand, in the case when the photomask having a square opening is used, the distribution intensity of near-field light is low. For this reason, in order to form the latent image, which reaches the depth of 20 Dm similarly, as in the above-described case, it is necessary to effect exposure for such a time that the iso-intensity line of an intensity of 0.15 provides a limit of solubility/insolubility of the resist. In other words, it is necessary to take an exposure time substantially two times that in the case of the rectangular opening. Further, when the same exposure condition is applied to the slit-like pattern, the resultant line pattern is subjected to excessive exposure. As a result, it is difficult to form a desired line pattern (FIG. 2B).

In this embodiment, the results described above are based on one calculation example, but a similar tendency is shown with respect to an opening having a size of not more than the wavelength of light. When the rectangular opening having a length and a width, which are different from each other, is used, it becomes possible to obtain near-field light having a higher intensity than the case of using the square opening. This is because, as one of a length and a width of the square opening is gradually increased to change the length and the width of the square opening, an intensity of near-field light leaking from the resultant opening becomes abruptly higher. More specifically, a degree of attribution of a vector component, parallel to the short side (width) of electrical field vectors directed in two polarization directions, is principally increased. However, light of such a polarization component is directed so that an electrical field in the neighborhood of the short side of the rectangular opening is parallel to an interface. As a result, an intensity of a near-field immediately in the neighborhood of the short side does not become higher. That is, when the shape of the opening is changed from a square to a rectangle, the opening is particularly irradiated with a polarized component of light, and an electrical field vector, which is parallel to the short side of the opening, is thereby generated, to immediately increase an intensity of light leaking from the opening. On the other hand, a degree of expansion of near-field light by such a polarized component is moderate, so that it becomes possible to obtain a higher-intensity near-field light when the rectangular opening having a length and a width, which are different from each other, is used.

In the case when the above-described phenomenon is used for near-field exposure, it is possible to set an exposure condition such that a higher-intensity iso-intensity line provides the limit of solubility/insolubility of the resist. For example, in the case of assuming a certain exposure condition which permits formation of a latent image having a desired size in a desired depth of the resist, with respect to a standard square opening, one of adjacent sides of the opening is increased to provide a rectangular opening. As a result, the intensity of near-field light can be increased. In this case, it is not necessary to effect polarization control of light with respect to the light source. When the intensity of near-field light becomes higher, it is possible to provide an equivalent amount of exposure light by effecting exposure in a shorter time. As an iso-intensity line (e.g., an intensity I0) being a measure of latent image formation, a new iso-intensity line having a higher intensity (e.g., an intensity I1 (e.g., I1=2×I0)), compared with the case of the square opening, is used. The iso-intensity line of intensity I0 becomes broader with an increase in a long side of the rectangular opening, but the new iso-intensity line of an intensity I1 may be used for exposure. As a result, it becomes possible to effect exposure in a short time without causing a remarkable increase in latent image size.

In view of the calculation results, a ratio of length to width (length/width ratio) of the rectangular opening for use with exposure, in accordance with the above-described mechanism, may appropriately be about 1.5. Further, in order to significantly enhance the light intensity as compared with the case of a square opening, the length/width ratio is required to be at least 1.1 times that of the square opening.

On the other hand, in order to provide a length/width ratio substantially equal to that of the square opening (e.g., not more than 1.1 times that (=1) of the square opening), when a fine light spot is formed by use of the rectangular opening in the neighborhood of the fine opening at an opening portion on the light incident side, it is necessary to provide the fine opening with the length/width ratio, which is two times that of the square opening. In other words, in the present invention, the fine opening may preferably have a length/width ratio of 1.1 to 2. As described above, when the rectangular opening is used with reference to the results of the analysis of the electromagnetic field, it is possible to obtain a light intensity, which is not less than two times that of the square opening. As a result, it is found that it becomes possible to reduce the exposure time required for forming the latent image, which reaches the same depth in the resist. Further, as shown in FIG. 1, when the photomask has the rectangular opening and the slit-like opening in combination, it is found that both patterns of the rectangular opening and the slit-like opening can be used for patterning under the same exposure condition.

Embodiments of the present invention will now be described more specifically.

Embodiment 1

Figure 3:
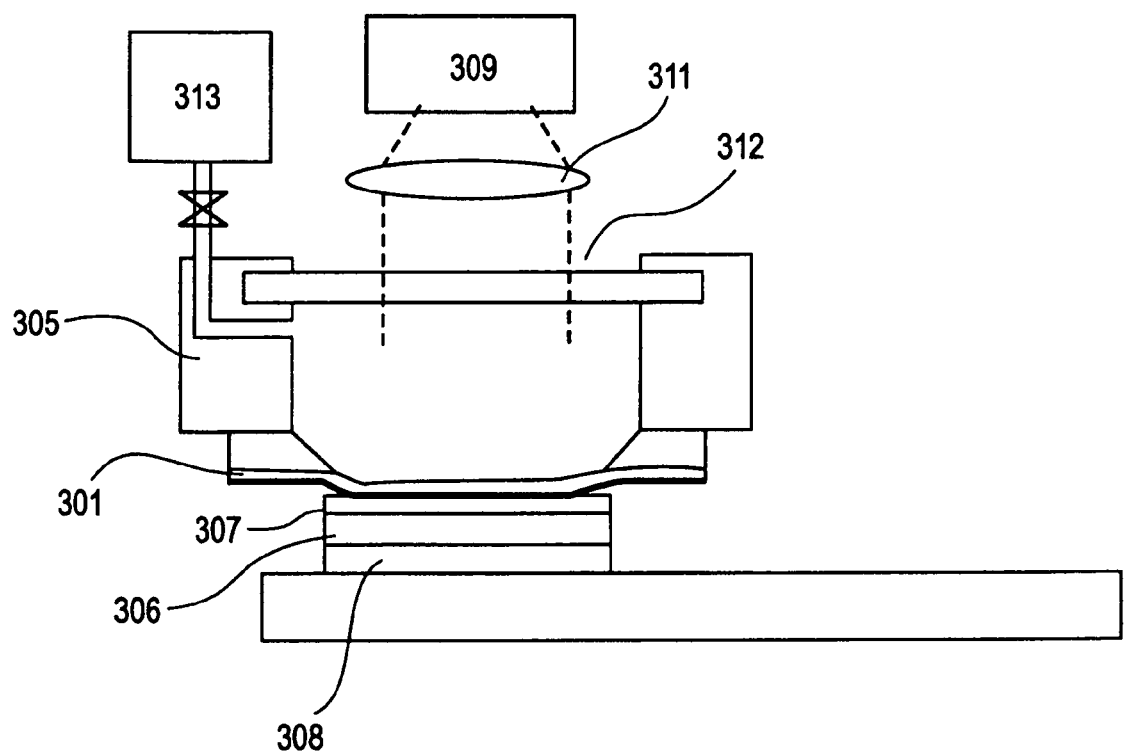
FIG. 3 is a schematic view showing a structure of a near-field exposure apparatus in Embodiment 1 of the present invention.

FIG. 3 shows a structure of a near-field exposure apparatus in Embodiment 1 of the present invention.

In the near-field exposure apparatus, a near-field exposure mask 301 is provided with a fine opening pattern, in combination with a slit-like line pattern, which has a length larger than a wavelength of light. The near-field exposure mask 301 has patterns in a light blocking film formed on an elastic mask base material. Herein, a "front surface" of the mask refers to a surface where the light blocking film (for the mask) is disposed, and a "rear surface" refers to a surface opposite from the front surface.

In this embodiment, the front surface of the photomask 301 is disposed apart from a pressure adjusting (regulating) vessel 305 and the rear surface is disposed to face the pressure adjusting vessel 305. The pressure adjusting vessel 305 is designed to permit adjustment of pressure therein by a pressure adjusting means 313.

A member to be exposed comprises a substrate 306 and a resist film 307 disposed on the surface of the substrate 306 (hereinafter referred to as the "resist 307/substrate 306").

The resist 307/substrate 306 is mounted on a stage 308 and the stage is driven to effect relative positional alignment of the substrate 306 with the photomask 301 in a two-dimensional direction with respect to the mask surface.

Next, the stage 308 is moved in a direction of a normal to the mask surface, to bring the photomask 301 into close contact with the resist 307 disposed on the substrate 306.

During the close contact operation, the pressure in the pressure adjusting vessel 305 is adjusted by the pressure adjusting means 313, so that a distance between the entire front surface of the photomask 301 for evanescent light and the resist 307 disposed on the substrate 306 becomes not more than 100 nm. Thereafter, exposure light emitted from an exposure light source 309 is changed to parallel light by a collimator lens 311, and passed through a glass window 312, to be introduced into the pressure adjusting vessel 305. The evanescent light exposure mask (photomask) 301 is irradiated with the light from its rear surface side. At that time, exposure of the resist 307 is performed by near-field light generated adjacent to the fine opening at the front surface of the photomask 301.

The mask pattern includes, as shown in FIG. 1, independent rectangular openings and a slit-like line pattern, having a length larger than the wavelength of light, in combination with the independent rectangular openings. Each of the rectangular openings has a width (short side) of 40 nm and a length (long side) of 60 nm, and the slit-like line pattern has a width of 30 nm.

A method of manufacturing the near-field exposure mask in this embodiment will be described in detail with reference to FIGS. 4A to 4D.

Figure 4A:
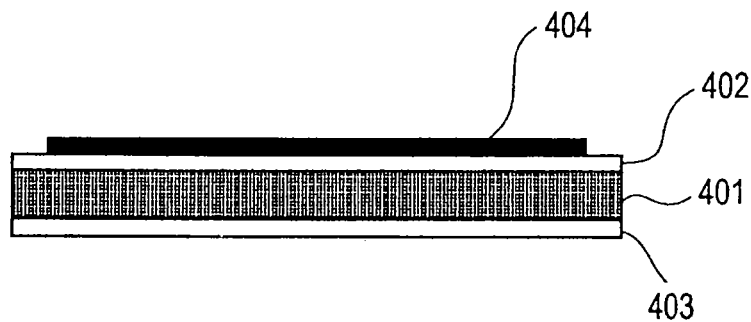
FIGS. 4A to 4D are schematic views for illustrating a method of manufacturing a near-field exposure photomask in Embodiment 1 of the present invention.

As shown in FIG. 4A, on a 500 μm-thick double-sided polished substrate 401 of Si (Si (100) substrate 401), a 0.8 μm-thick SiN film 402, as a mask base material, is formed at the front surface (an upper surface in FIG. 4A of the substrate 401 by an LP-CVD (low pressure-chemical vapor deposition) method, and a 0.8 μm-thick SiN film 403 as an etching window is formed at the rear surface (a lower surface in FIG. 4A) by an LP-CVD method. Thereafter, on the surface of the SiN film 402, a 70 μm-thick Cr film 404 is formed by a vapor deposition method, while effecting control of the film thickness by a film thickness monitor by use of a quartz oscillator.

Figure 4B:
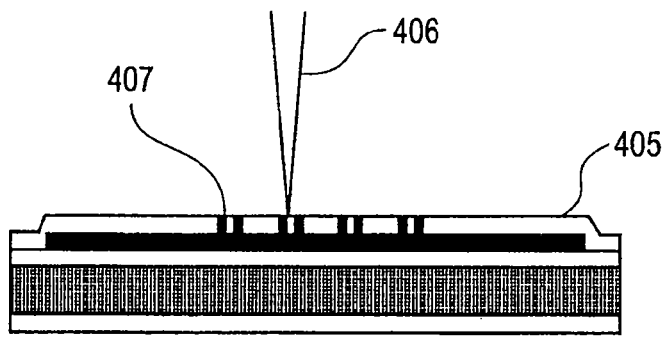

Then, onto the surface of the Cr film 404, a resist 405 for an electron beam is applied, and a pattern 407, including a width of 20 nm and a width of 50 nm, is formed by electron beam 406 (FIG. 4B). After development, the resist 405 is subjected to dry etching with $CCl_4$ to provide a fine opening pattern 408 (FIG. 4C).

Figure 4C:
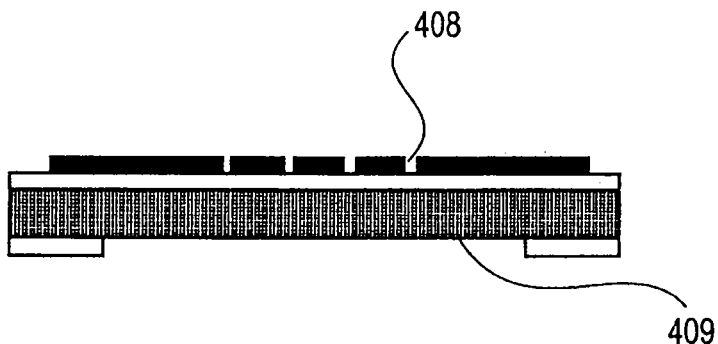
Figure 4D:
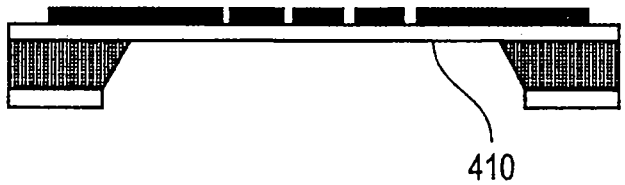

A part of the SiN film 403 (formed at rear (lower) surface of the substrate 401) is removed to form a window 409 for etching (FIG. 4C). Anisotropic etching with a KOH solution is performed from the rear (lower) surface side of the substrate 401 to remove a part of the Si substrate 401, to provide a mask 410 principally comprising the SiN film 402 and the Cr film 404 (FIG. 4D).

In this embodiment, in the step of forming the fine opening pattern 408 in the Cr film 404, the electron beam processing is employed, but other processing methods, such as focused ion beam processing, X-ray lithography, and scanning probe microscope (SPM) processing, may be used. Of these processing methods, such a processing that the SPM technique represented by a scanning tunnel microscope (STM), an atomic force microscope (AFM) or a scanning near-field optical microscope (SNOM) is applied thereto, may preferably be used, since it becomes possible to form a very fine opening pattern of not more than 10 nm when formation of the fine opening pattern is performed by the processing.

Referring gain to FIG. 3, as a material for the resist 307, a photoresist material used in an ordinary semiconductor process may be selected.

With respect to the resist material, a wavelength of light which permits exposure is in the range of about 200-500 nm. However, when a photoresist, which is sensitive to g line and i line of a mercury (Hg) lamp in a wavelength range of 350-450 nm is selected, it becomes desirable to allow more process latitude and reduction in cost, since such a resist material has a great choice, and is relatively inexpensive.

The exposure light source 309 is required to emit light having an exposable wavelength with respect to the resist 307 being used. For example, when the photoresist for the above-described g line or i line (of Hg) is selected as the resist 307, as the light source 309, those including HeCd laser (light wavelength: 325 nm, 442 nm), GaN-type blue semiconductor laser (410 nm), a second or third harmonic generation (SHG or THG) laser of an infrared light laser, and a mercury (Hg) lamp (g line: 436 nm, i line: 365 nm) may be used.

An amount of exposure light is adjusted by controlling a drive voltage, a drive current and an irradiation time of the exposure light source 309. In this embodiment, the g line (wavelength: 436 nm) of the Hg lamp is used, so that an area of 100 nm×100 nm is irradiated with the g line light by use of a collimator lens through a wavelength selection filter. A power of the light is monitored by a power meter, and an exposure time is set so that the light exposure amount of the resist exceeds a threshold with respect to exposure. In this case, it is necessary to adjust the light exposure amount in view of light transmittance of the photomask as the exposure is performed through the photomask.

FIGS. 5A to 5D are views for illustrating a method of forming a pattern including one buffer layer by use of the near-field exposure mask in this embodiment.

Figure 5A:
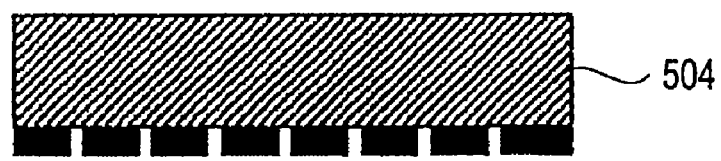
FIGS. 5A to 5D are schematic views for illustrating a method of forming a pattern including a single buffer layer by use of the near-field exposure photomask in Embodiment 1 of the present invention.

FIG. 5A shows a photomask 504 and a member to be exposed to light.

The photomask 504 is a photomask identical to that described above with reference to FIG. 3.

Onto an Si substrate 501, a positive photoresist is applied by use of a spin coater and heated at 120° C. for thirty minutes to form a 400 nm-thick first layer 502. Onto the first layer 502, an Si-containing negative photoresist is applied and pre-baked to form a 20 nm-thick second layer 503.

The Si substrate 501, onto which the photoresist having a two-layer structure is applied, and the photomask 504, are caused to come close to each other by the near-field exposure apparatus, and pressure is applied thereto to bring the resist layer 503 and the photomask 504 in close contact with each other.

Figure 5B:
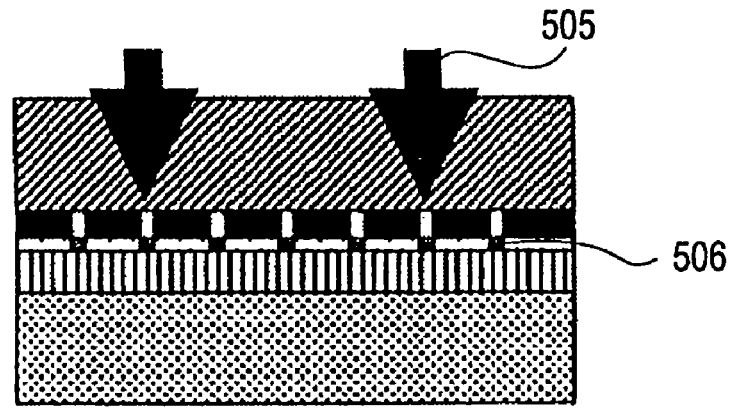
Figure 5C:
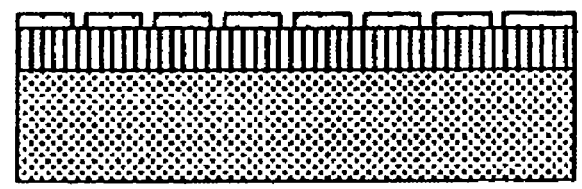

The resultant structure is irradiated with exposure light 505 through the photomask 504, whereby the pattern on the photomask 504 is exposed to the light, and thus, a portion 506 of the photoresist layer 503 is also exposed to light (FIG. 5B). Thereafter, the photomask 504 is removed from the photoresist surface, and the photoresist 503 is subjected to development and post-baking, whereby the pattern on the photomask 504 is transferred to the photoresist as a resist pattern (FIG. 5C).

Figure 5D:
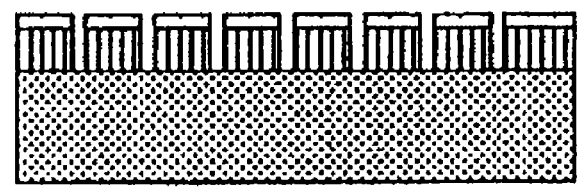

Thereafter, by using the pattern of the photoresist (second layer) 503 as an etching mask, the photoresist (first layer) 502 is etched by oxygen reaction ion etching (FIG. 5D). The oxygen reactive ion etching has a function of oxidizing Si contained in the photoresist (second layer) 503, to increase a resistance to etching of the second layer.

As described above, it becomes possible to transfer various patterns on the photomask onto the substrate 501, as a resist pattern with a clear (high) contrast.

Embodiment 2

Figure 6:
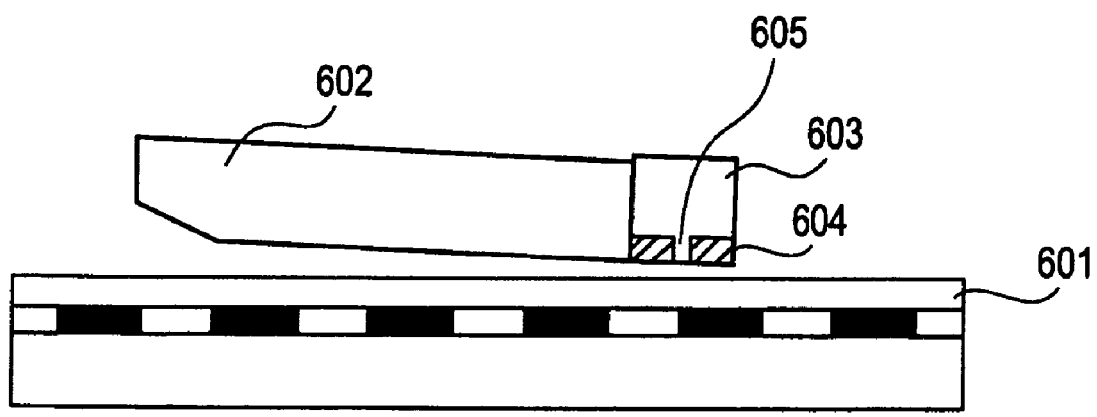
FIG. 6 is a schematic view showing a structure of a near-field optical head in Embodiment 2 of the present invention.

FIG. 6 shows a structure of an optical head in Embodiment 2 of the present invention.

In FIG. 6, a slider 602 is held by an arm (not shown) so that it is apart from an optical disk 601, such as a magneto-optical disk, or an optical disk using fine pits or phase change recording, by a predetermined distance. The predetermined distance is substantially not more than a size of an opening of a near-field light source. The slider 602 is reciprocated by an actuator (not shown) in a predetermined range on the optical disk 601. On the slider 602, a near-field probe 603, according to the present invention as a near-field light source, is mounted. The near-field probe 603 is irradiated, though an objective lens, with light from a semiconductor laser light source, which is not mounted on the slider 602 after being shaped into a collimated beam by a collimator lens. A focus of the objective lens is controlled by a drive actuator, so as to follow with respect to (external) disturbance, such as a vertical motion of the optical head, depending on an unevenness of the medium.

The near-field probe 603 in the present invention comprises a glass substrate and a thin metal film 604, provided with a rectangular fine opening 605, disposed on the glass substrate. The rectangular fine opening 605 has an opening size of 80 nm (width)×120 nm (length). Compared with a square fine opening having an opening size of 80 nm×80 nm, the rectangular fine opening provides a light intensity, which is 1.5 times that of the square fine opening, without substantially increasing a size of a resultant near-field light spot. Accordingly, it is possible to provide an efficient optical head.

A change in reflection characteristic of the optical disk 601 leads to a change in scattering characteristic of near-field light, so that it becomes possible to read information recorded in the disk as a change in the amount of light returned to the optical head through the fine opening.

Further, by disposing a magnetic recording head in the neighborhood of the optical head, and locally heating a recording medium through near-field light energy, it is also possible to provide a light-assisted magnetic recording head, which facilitates magnetic writing.

The optical head, as a light source, for effecting recording in the optical disk, can also be utilized as an illumination-mode near-field optical microscope. The optical head, as a light source, for reading information from the optical disk can also be utilized as an illumination/light-gathering mode near-field optical microscope. In these cases, a near-field optical microscope apparatus is constituted by a sample stage for permitting two-dimensional scanning of a sample by mounting the sample thereon, and a probe-driving system for bringing a near-field light source near to the sample. More specifically, the probe-driving system includes a cantilever, a piezoelectric actuator, etc., and controls a distance between the near-field light source and the sample.

INDUSTRIAL APPLICABILITY

As described above, according to the present invention, it is possible to provide a method of generating near-field light, capable of generating a higher-intensity near-field light at a high efficiency. Further, it is also possible to provide a near-field exposure mask, a near-field exposure method, a near-field exposure apparatus, and a near-field optical head, which are usable in the near-field light generating method, in combination. It is further possible to provide a near-field optical microscope and a recording and/or reproducing apparatus, which employ the near-field optical head.

The invention claimed is:

1. A near-field light generating method for irradiating light from a light source to a metal film that has a fine opening having a size of not more than a wavelength of the light emitted from the light source, and forming a fine light spot adjacent to the fine opening on a light outgoing side of the fine opening, said method comprising:

providing the metal film with a rectangular fine opening whose length to width ratio is between 1.1 times and 2 times that of a standard square opening, obtained by increasing the length of the standard square opening; and irradiating the metal film with light from the light source to form the fine light spot, which has a length and a width that are substantially equal to those of the standard square opening, and wherein the fine light spot has a light intensity, which is not less than two times that of the standard square opening.

2. A near-field light generating method according to claim 1, wherein the length to width ratio is about 1.5 times that of the standard square opening.

3. A near-field optical head comprising:

a light blocking film comprised of a metal film; and a rectangular fine opening formed in the metal film, the rectangular fine opening having size not more than a wavelength of light emitted from a light source, the light from the light source irradiating the metal film to form a fine light spot, wherein a length to width ratio of the rectangular fine opening is between 1.1 times and 2 times that of a standard square opening, obtained by increasing the length of the standard square opening, and the fine light spot has a length and width that are substantially equal to those of the standard square opening, and wherein the fine light spot has a light intensity, which is not less than two times that of the standard square opening.

4. A near-field optical microscope for effecting surface observation of a sample, said microscope comprising:

a near-field optical head according to claim 3.

5. A recording and reproducing apparatus for effecting recording and reproduction with respect to a recording medium, said apparatus comprising:

a near-field optical head according to claim 3.

* * * * *